United States Patent [19]

Keneto et al.

[11] Patent Number: 5,279,798
[45] Date of Patent: Jan. 18, 1994

[54] SILICON SINGLE CRYSTAL MANUFACTURING APPARATUS

[75] Inventors: Takeshi Keneto; Hiroshi Kamio, both of Tokyo, Japan

[73] Assignee: NKK Corporation, Tokyo, Japan

[21] Appl. No.: 778,885

[22] PCT Filed: Apr. 24, 1991

[86] PCT No.: PCT/JP91/00548
   § 371 Date: Dec. 23, 1991
   § 102(e) Date: Dec. 23, 1991

[87] PCT Pub. No.: WO91/17290
   PCT Pub. Date: Nov. 14, 1991

[30] Foreign Application Priority Data

Apr. 27, 1990 [JP] Japan .................. 2-114521

[51] Int. Cl.[5] .................................. C30B 15/30
[52] U.S. Cl. ........................ 422/249; 156/617.1;
   156/620.4; 156/DIG. 64; 422/245
[58] Field of Search ........... 156/617.1, 618.1, 619.1,
   156/620.4, DIG. 64, 422/245, 249

[56] References Cited

U.S. PATENT DOCUMENTS 4,894,206  1/1990  Yamashita et al. .............. 422/249
4,911,895  3/1990  Kida et al. ....................... 422/245
4,957,712  9/1990  Shima et al. .................... 422/249
5,009,862  4/1991  Kida et al. ....................... 422/249
5,009,863  4/1991  Shima et al. .................... 422/249
5,069,741  12/1991 Kida et al. ..................... 156/617.1

FOREIGN PATENT DOCUMENTS 0320115  6/1989  European Pat. Off. .
1013824  12/1965 United Kingdom .

Primary Examiner—Olik Chaudhuri
Assistant Examiner—FeLisa Garrett
Attorney, Agent, or Firm—Michael N. Meller

[57] ABSTRACT

A silicon single crystal manufacturing apparatus whereby a silicon single crystal having a large diameter and stable composition is pulled at a high rate in accordance with the Czochralski method which rotates a crucible. The apparatus features that a partition member is of a crucible type, that the partition member above the surface of molten silicon has a thickness which is not less than 3 mm and not greater than 80% of the thickness of the partition member below the molten silicon surface, that the bottom portion of the partition member is closely fixed to the bottom portion of the crucible and that the partition member is supported on a cylindrical quartz member.

5 Claims, 9 Drawing Sheets

SILICON SINGLE CRYSTAL MANUFACTURING APPARATUS

TECHNICAL FIELD

The present invention relates to an apparatus for manufacturing large-diameter silicon single crystals according to the Czochralski method. More particularly, the invention relates to a silicon single crystal manufacturing apparatus including a rotation-type quartz crucible containing molten silicon, an electric resistance heater for heating the quartz crucible from the side thereof, a quarts partition member arranged to divide the molten silicon to an inner single crystal growing section and an outer material melting section within the quartz crucible and having small holes for permitting passage of the molten silicon therethrough, and starting material feed means for continuously feeding starting material silicon to the material melting section.

BACKGROUND ART

In the field of LSIs, the required diameter for silicon single crystals has been increased year after year. At present, crystals of 6 inches in diameter are used for the latest devices. It is said that in the future crystals of 10 inches or over in diameter, e.g., crystals of 12 inches in diameter will be needed.

In accordance with the Czochralski method (CZ method) which is known as a method of manufacturing large-diameter silicon single crystals, the amount of molten silicon in a crucible is decreased as a single crystal is grown. As a result, the dopant concentration is increased and the oxygen concentration is decreased in the crystal as the crystal is grown. In other words, the properties of the crystal are varied in the direction of its growth. Since the quality required for silicon single crystals has been made severer year after year with increase in the level of integration of LSIs, this problem must be overcome.

As a means of solving this problem, a method has been known from the old in which the interior of a quartz crucible according to the ordinary Czochralski method is divided by a quartz crucible having small holes for molten silicon so that the inner side forms a single crystal growing section and the outer side forms a material melting section thereby growing a cylindrical silicon single crystal on the inner side while continuously feeding starting material silicon to the material melting section, and many patents have been disclosed (Patent Publication No. 40-10184, Laid-Open Patent No. 62-241889, Laid-Open Patent No. 63-233092, Laid-Open Patent No. 63-319287, Laid-Open Patent No. 64-76992 and Laid-Open Patent No. 1-96087).

Where a silicon single crystal is manufactured by use of a double structure crucible incorporating therein a partition member on the basis of the prior art technique such as described above, however, the heat environment in the molten silicon is the very opposite to that in cases in which the ordinary single structure crucible without any partition member is used.

FIGS. 9 and 10 are longitudinal section views respectively showing the cases of the above-mentioned single structure crucible and double structure crucible. In the Figures, numeral 21 designates a crucible, 22 a partition, 4 molten silicon, 5 a pulled silicon single crystal, and 12 small holes formed through the partition 22 for molten silicon. Also, arrows show the directions of the convection of molten silicon. In the case of FIG. 9, the crucible side wall portion is higher in temperature than the crucible bottom portion. In other words, the amount of heat supplied through the crucible side wall portion is greater than the amount of heat supplied through the crucible bottom portion. Reflecting this fact, the convection of the molten silicon within the quartz crucible 21 is predominated by the flows indicated by the arrow in FIG. 9. In the case of FIG. 10, however, the amount of heat supplied to the single crystal growing section through the crucible side is such that the proportion of the heat input through the bottom portion of the crucible 21 is increased as compared with the case of FIG. 9. This is due to the fact that the side portion of the partition 22 is remote from the heat source and the temperature distribution in the molten silicon 4 of the material melting section is higher in temperature in the bottom portion than in the remainder. In such heat environment where the proportion of the heat input through the bottom portion is great, there is a tendency that the heat convection of the molten silicon within the single crystal growing section is predominated by the convection as shown in FIG. 10 which is the very opposite to FIG. 9. In the case of such convection, the high-temperature molten silicon in the bottom portion of the crucible 21 is directly moved to the solid-liquid interface of a silicon single crystal and therefore there is caused a problem that the stable pulling of the silicon single crystal is impeded.

The present invention has been made in view of these circumstances and it is an object of the invention to provide a silicon single crystal manufacturing apparatus which employs a double structure crucible having a partition member so that high-temperature molten silicon in the bottom portion of the crucible is not moved to the solid-liquid interface and the stable pulling of a silicon single crystal is ensured.

DISCLOSURE OF INVENTION

A silicon single crystal manufacturing apparatus according to a first invention includes a rotation-type quartz crucible containing molten silicon, an electric resistance heater for heating the quartz crucible from the side thereof, a quartz partition member arranged to divide the molten silicon into an inner single crystal growing section and an outer material melting section within the quartz crucible and having small holes for permitting the passage of the molten silicon therethrough, and starting material feed means for continuously feeding starting material silicon to the material melting section, and it is characterized in that the partition member is of a crucible type, that the bottom portion of the partition member is closely fixed to the bottom inner surface of the quartz crucible, and that the average value of the wall thicknesses of the partition member above the molten silicon surface is over 3 mm and less than 80% of the average value of the wall thicknesses of the partition member below the molten silicon surface.

A silicon single crystal manufacturing apparatus according to a second invention includes a rotation-type quartz crucible containing molten silicon, an electric resistance heater for heating the quartz crucible from the side thereof, a quartz partition member arranged to divide the molten silicon into a single crystal growing section on the inner side and a material melting section on the outer side within the quartz crucible and having small holes for permitting the passage of the molten silicon therethrough, and starting material feed means for continuously feeding starting material silicon to the material melting section, and it is characterized in that the partition member is of a crucible type, that the bottom portion of the partition member is fixed closely to the bottom inner surface of the quartz crucible, and that the bottom portion of the partition member has an inner diameter smaller than the outer diameter of the side of the partition member and it is supported on a cylindrical quartz member having an outer diameter greater than the inner diameter of the partition member. By virtue of these features, the amount of heat input through the side portion is increased as compared with the amount of heat input through the bottom portion within the single crystal growing section so that the heat environment of the molten silicon is equivalent to the heat environment within the ordinary single structure crucible and also the occurrence of a sinking deformation of the partition member after the lapse of a long period of time is prevented.

IN THE DRAWINGS

Numeral 1 designates a quartz crucible, 2 a graphite crucible, 3 a pedestal, 4 molten silicon, 5 a silicon single crystal, 6 an electric resistance heater, 7 heat insulating member, 8 a chamber, 11 a crucible-type partition member, 12 small holes, 14 starting material feed means, 30 a cylindrical quartz member, and 31 through-holes.

BEST MODE FOR CARRYING OUT THE INVENTION

Figure 10:
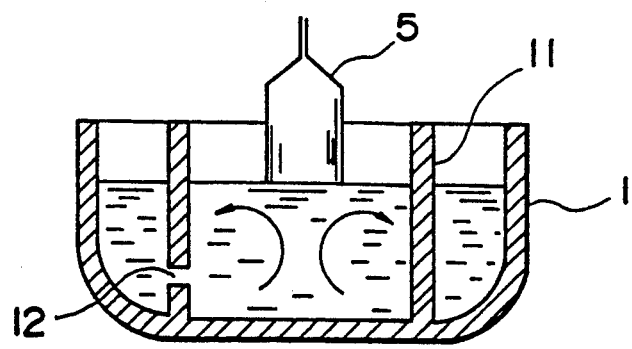
FIG. 10 is a diagram schematically showing the convection of the molten silicon within the double structure crucible.
Figure 11:
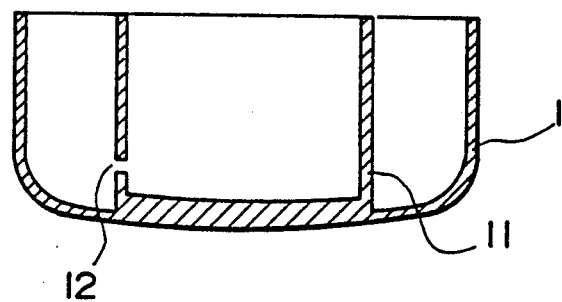
FIG. 11 is a longitudinal sectional view showing a conventional crucible which has a partition and in which the bottom portion of a single crystal growing section is increased in the quartz thickness.

Firstly, the studies and investigations made until the discovery of the present invention will be explained. In order to overcome the deficiencies of a double structure crucible of the type in which a cylindrical partition member is arranged within a quartz crucible as shown in the previously mentioned FIG. 10, a study was made as a first step to use a double structure crucible of the type in which the quartz of the bottom portion of a single crystal growing section such as shown in FIG. 11 was increased in wall thickness. In the Figure, numeral 1 designates a crucible constructed integrally with a partition 11 having small holes 12 and the bottom of its single crystal growing section is increased as compared with the other portions.

By increasing the thickness of the quarts in the bottom portion of the single crystal growing section, the amount of heat supplied through the bottom within the single crystal growing section can be reduced. As a result, the amount of heat input through the side of the single crystal growing section can be increased relatively and the heat convection equivalent to the case employing the ordinary single structure crucible can be obtained. However, the industrial use of a crucible in which the wall thicknesses of the various parts are not uniform gives rise to a problem from the production costs point of view.

Then, as a second step, it was considered that in order to construct a double structure crucible in which the bottom portion of a single crystal section was increased in quartz thickness, the equivalent effect would be obtained by arranging within a quartz crucible a crucible-type partition member having a bore smaller than the bore of the quartz crucible.

However, where two quartz crucibles of different bores are assembled to construct a double structure crucible, the following problems are caused. In other words, the bottom of the ordinary quartz crucible inevitably has a radius of curvature from the production point of view. In other words, the shape of the ordinary quartz crucible is determined by the bore, the radius of curvature of the crucible bottom portion and the radius of curvature of the portion connecting the bottom and side portions of the crucible. Where a double structure crucible is constructed by assembling two quartz crucibles of different bores, a space corresponding to the difference in radius of curvature is formed between the inner surface of the quartz crucible and the bottom outer surface of the crucible-type partition member.

Figure 2:
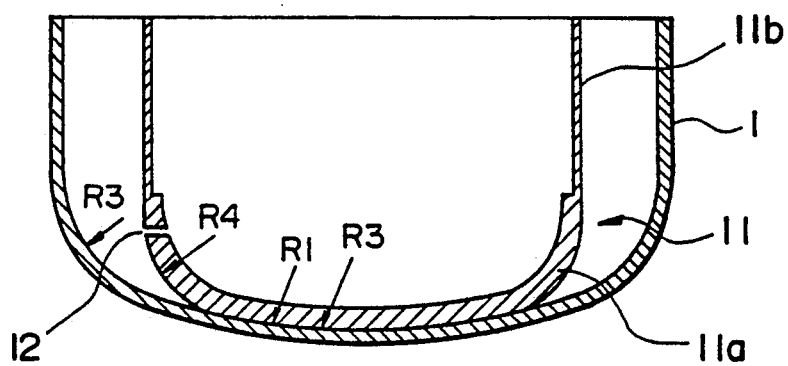
FIG. 2 is a longitudinal sectional view showing the partition member of the present embodiment whose upper part is decreased in thickness in a stepwise manner.

In order to reduce the space to a minimum firstly the radius of curvature $R_1$ of the quartz crucible bottom inner surface and 3 the radius of curvature $R_3$ of the crucible-type partition member bottom outer surface must be made equal to each other as shown in FIG. 2. Further, the value of $R_4$ of the crucible-type partition member must be as small as possible. In accordance with the ordinary manufacturing method, however, it is impossible to reduce the value of $R_4$ to zero perfectly.

For instance, if a crucible-type partition member having a diameter of 14 inches, $R_3$ whose value is equal to $R_1$ and $R_4$ of 50 mm is arranged within a quartz crucible of 20 inches in diameter thereby constructing a double structure crucible, a space of about 15 mm at the maximum is formed between the bottom outer surface of the crucible-type partition member and the bottom inner surface of the quartz crucible.

Figure 12A:
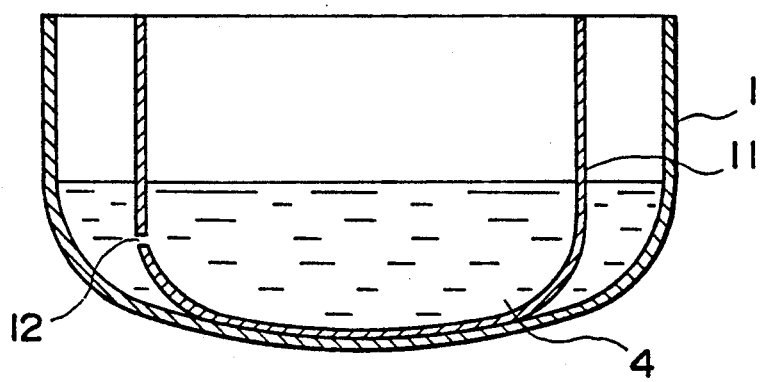
FIG. 12a is a longitudinal sectional view of a case in which a conventional crucible-type partition member is used.
Figure 12B:
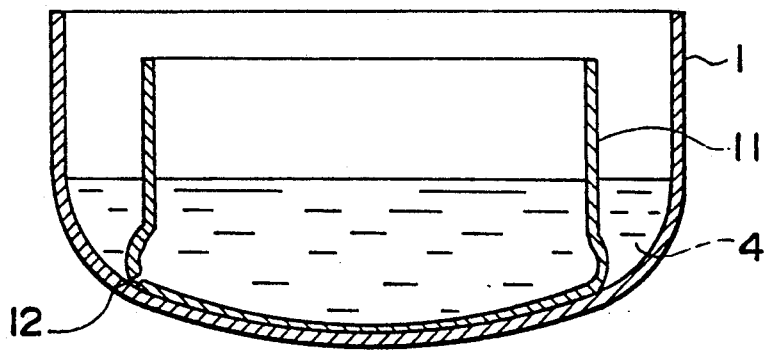
FIG. 12b is a longitudinal sectional view showing a deformation of the crucible-type partition member in the same case.

When the double structure crucible of this shape is used for a long time period of over 20 hours,, there is a problem that the portion of the crucible-type partition member immersed in the high-temperature molten silicon is softened and the crucible-type partition member is sunk lunder its own weight as the time passes. FIGS. 12a and 12b are longitudinal sectional views each showing a crucible constructed by concentrically arranging a crucible-type partition member 11 of a uniform wall thickness in a crucible 1, and numeral 12 designates small holes for passing molten silicon 4 therethrough. FIG. 12a shows the condition before the growing of a single crystal, and FIG. 12b shows the condition after the growing of the single crystal. While the crucible 1 and the crucible-type partition member 11 are on the same before the single crystal growth, after the growth crucible-type partition member is sunk and its height is decreased.

As the result of the sinking of the crucible type partition member, the molten silicon position is varied or variation is caused in the volume of the single crystal growing section and the material melting section, respectively, and the crystal growing condition varies with time. Also problems are caused, such as, the clogging of the small holes formed through the crucible-type partition member for the movement of molten silicon and the decrease in the amount of the molten silicon on the outer side of the crucible-type partition member.

Figure 1:
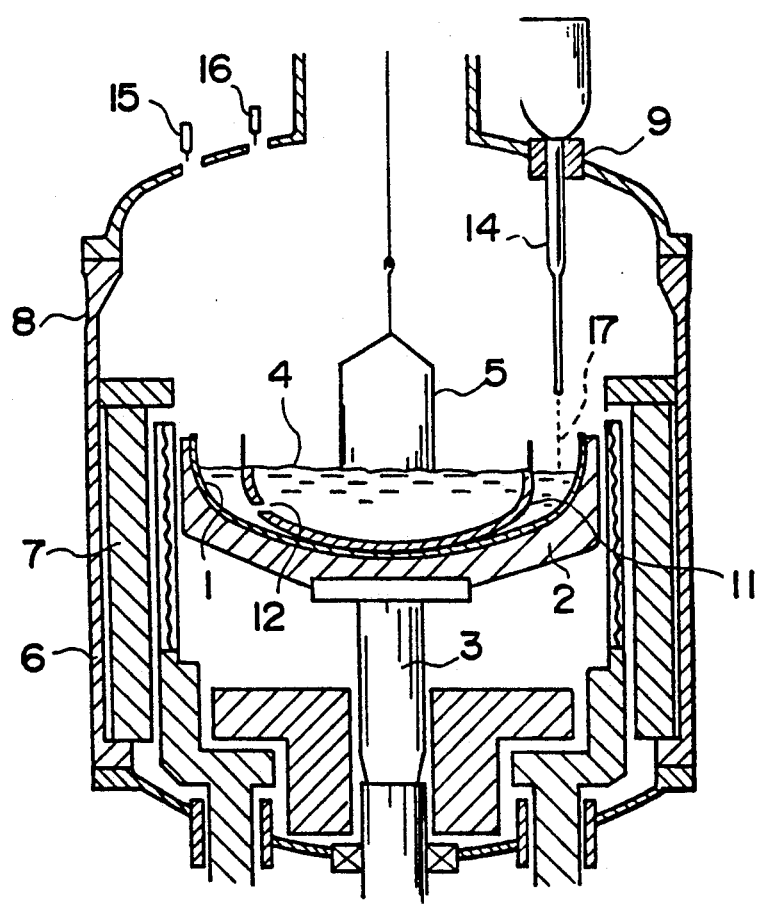
FIG. 1 is a silicon single crystal manufacturing apparatus showing an embodiment the present invention.

An embodiment of the present invention made as a third step on the basis of the foregoing considerations will be described. FIG. 1 is a sectional views of a silicon single crystal manufacturing apparatus used in cases where a silicon single crystal is pulled by use of such quartz crucible as mentioned above. In the Figure, numeral 1 designates a quartz crucible which is set in a graphite crucible 2, and the graphite crucible 2 is vertically movably and rotatably supported on a pedestal 3. Numeral 4 designates molten silicon contained in the crucible 1, and a silicon single crystal 5 grown into a cylindrical shape is pulled from the molten silicon 4. Numeral 6 designates an electric resistance heater surrounding the graphite crucible 2, 7 a hot-zone heat insulating member, and 8 chamber in the form of a hermetic container, with these components being basicaly the same with the single crystal pulling apparatus according to the ordinary Czochralski method. Numeral 14 designates silicon starting material feed means, 17 silicon starting material, and 15 and 16 temperature detectors.

FIG. 2 is an enlarged longitudinal sectional view of the crucible I in the silicon single crystal manufacturing apparatus shown in FIG. 1. In the Figure, numeral 1 designates the quartz crucible, and 11 the crucible-type partition member. The crucible-type partition member 11 is concentrically disposed within the quartz crucible 1. The crucible-type partition member 11 is preliminarily fused to the quartz crucible 1. Numeral 12 designates the small holes formed through the partition member so that the molten silicon is supplied unidirectionally from the outer side to the inner side of the partition through the small holes 12 during the growing of the silicon single crystal 5. According to the present embodiment, the quartz crucible 1 comprises a quartz crucible having an inner diameter, 484 mm; an outer diameter, 500 mm; a bottom inner surface radius of curvature $R_1$, 500 mm; a radius of curvature $R_2$ of the portion connecting the bottom and side portions, 120 mm; and a crucible height, 250 mm. The crucible-type partition member 11 comprises a quartz crucible having an outer diameter of 350 mm, $R_3$ of 500 mm, $R_4$ of 50 mm, and a crucible height of 250 mm. Also, the average wall thickness of the portion of the crucible-type partition member extending from its bottom to the height of 110 mm s selected 14 mm and the average wall thickness of the remaining upper part is selected 5 mm.

In the silicon single crystal manufacturing apparatus shown in FIG. 1, after 25 Kg of silicon starting material has been melted by use of such double structure quartz crucible as shown in FIG. 2, a silicon single crystal is pulled with the result that the amount of heat input through the bottom portion of the single crystal growing section is reduced and also the sinking of the crucible-type partition member is practically prevented, thus making it possible to effect the stable pulling of a silicon single crystal even after the lapse of a long period of time.

Figure 3:
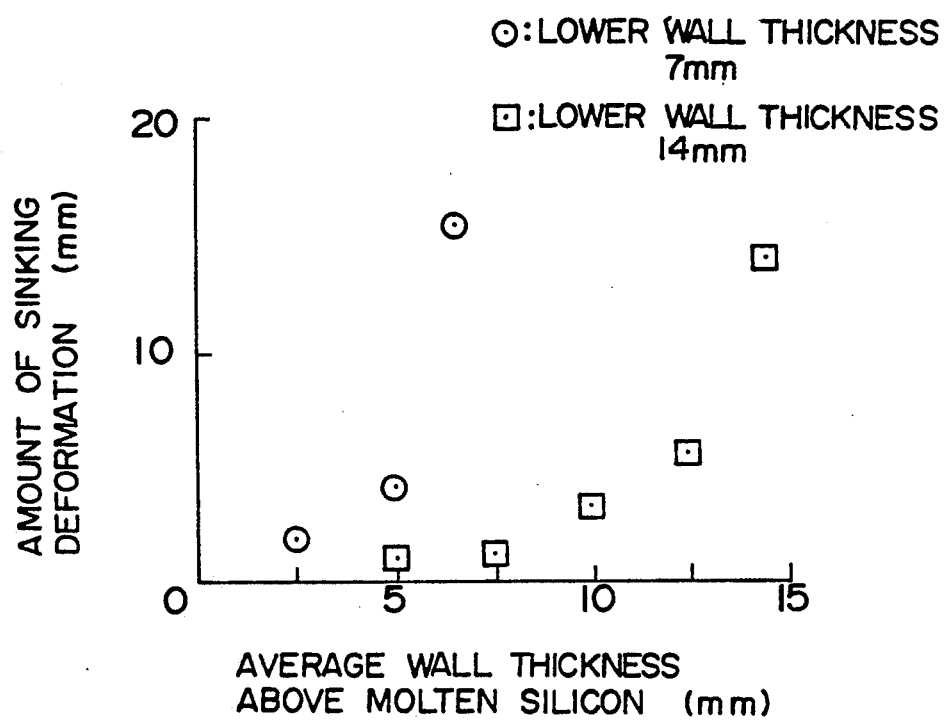
FIG. 3 is a graph showing the relation between the wall thickness of the partition member and the amount of sinking deformation.

To confirm the effect of the embodiment of the present invention, the amounts of sinking deformation of the crucible-type partition members 11 were examined in cases where the average wall thickness of the crucible-type partition member 11 below the molten silicon surface (the portion of the crucible-type partition member between its bottom portion and below 110 mm) was selected 7 mm and 14 mm, respectively, and the average wall thickness of the portion above the molten silicon was varied in each of the cases. FIG. 3 shows the results of the measurements made by bloading 25 Kg of silicon starting material into the quartz crucible 1, heating and melting to the material and then measuring the amounts of sinking deformation of the crucible-type partition members 11 after the expiraton of 40 hours.

As will be seen from FIG. 3, where the wall thickness of the crucible-type partition member 11 is increased uniformly (when changing from 7 mm to 14 mm) while the rigidity of the crucible is increased, the weight of its cylindrical portion above the molten silicon is also increased and thus the crucible bottom portion is deformed. It has been found out that by selecting the average wall thickness of the crucible-type partition member 11 above the molten silicon surface to be less than 80% of the average wall thickness of the partition portion below the molten silicon, it is possible to prevent any sinking of the partition member tending to produce an effect on the single crystal growth. Also, it has been found out that if the average wall thickness of the portion above the molten silicon is reduced to less than 3 mm, any sinking deformation of the crucible-type partition member can be prevented but a flexible deformation is produced in the portion above the molten silicon.

Figure 4:
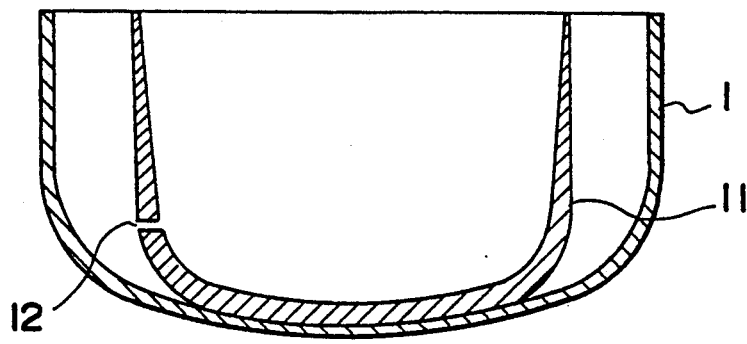
FIG. 4 is a longitudinal sectional view showing a partition member of the present embodiment whose upper part is decreased in thickness in a tapered manner.

FIG. 4 is a diagram showing another embodiment of the present invention and this embodiment is designed so that the wall thickness of the side portion of the crucible-type partition member is reduced in a tapered manner toward the upper end.

Also, the crucible construction such as shown in FIG. 1 or 4 in which the upper and lower portions are different in average wall thickness value may be replaced by a two-parts construction including upper and lower parts which are separately produced and adapted to be coupled in use. For instance, in FIG. 2 a thick walled lower part 11a and a thin-walled upper part 11b which is to be exposed on the molten silicon surface may be produced separately and the lower part 11a may be formed with notches thereby fitting together the upper part 11b and the lower part 11a at the notches. Alternatively, instead of providing the lower part 11 with notches, pawl-like quartz projections may be welded onto the top of the lower part 11a so as to engage the upper part 11b with the projections.

Figure 5:
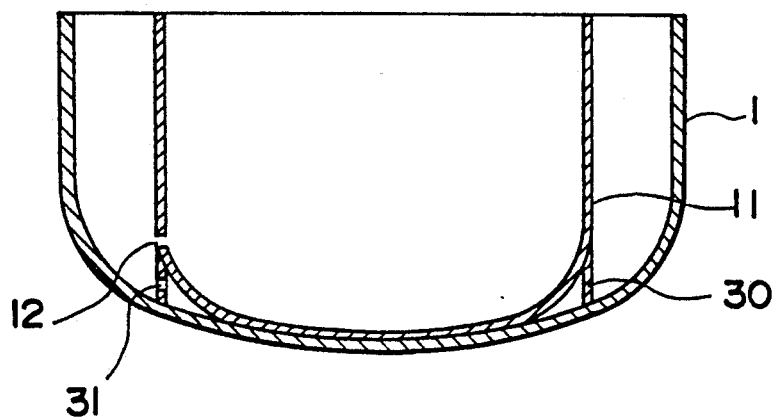
FIG. 5 is a longitudinal sectional view showing a partition member supported on a quartz cylindrical member.

Referring to FIG. 5 showing another embodiment of the present invention, the bottom portion of the partition member 11 is supported on a cylindrical quartz member 30. In FIG. 5, the quartz crucible 1 is identical in dimension and shape with the crucible 1 shown in FIG. 1. The partition member 11 has the same external surface shape as the partition member 11 shown in FIG. 1 and it has a uniform wall thickness of 7 mm. On the other hand, the cylindrical quartz member 30 has an inner diameter of 336 mm, a wall thickness of 7 mm and a height of 15 mm and its side is formed therethrough with holes 31 of 5 mm in diameter which are arranged at 8 locations at regular intervals.

Figure 6:
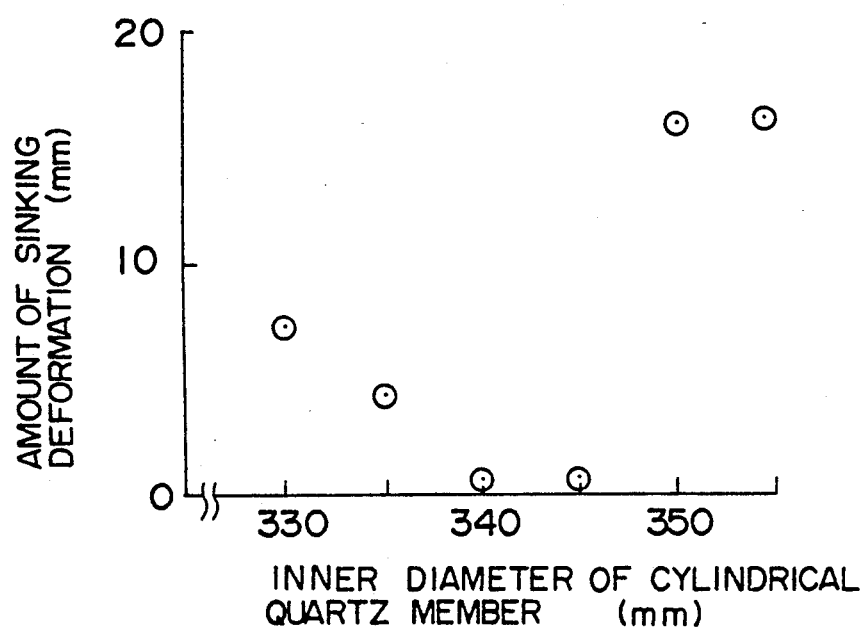
FIG. 6 is a graph showing the relation between the inner diameter of the quartz cylindrical member and the amount of sinking deformation of the partition member.

FIG. 6 shows the results of experiments conducted to confirm the effect of the embodiment shown in FIG. 5. The experiments were conducted by using cylindrical quartz members 30 which had a uniform wall thickness of 7 mm and were difference in inner diameter. Also, in conformity with the shape of the double structure quartz crucible, the height of each cylindrical quartz member was determined in such a manner that the cylindrical quartz member was brought into contact with both of the bottom inner surface of the quartz crucible and the bottom outer surface of the crucible-type partition member. 25 Kg of silicon starting material was loaded into the crucible. FIG. 6 shows the relation between the amount of sinking deformation of the crucible-type partition member at the expiration of 40 hours after the melting of the silicon starting material under the above-mentioned experimental conditions and the inner diameter of the cylindrical quartz member.

As will be seen from FIG. 6, if the inner diameter of the cylindrical quartz member 30 is greater than 350 mm, the cylindrical quartz member and the crucible-type partition member do not contact with each other and therefore there is as a matter of course no effect of preventing any sinking of the crucible-type partition member.

Figure 7:
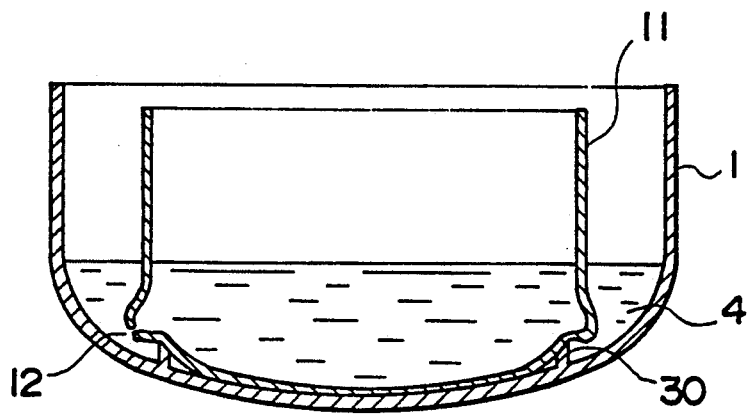
FIG. 7 is a longitudinal sectional view showing a comparative example in which the partition member supported on the quartz cylindrical member is deformed.

FIG. 7 shows a comparative case in which the outer diameter of the cylindrical quartz member 30 is smaller than the inner diameter of the partition member 11 and it is seen that a sinking deformation is caused in the crucible-type partition member in the condition following the growing of a single crystal under the test conditions of FIG. 6.

Figure 8:
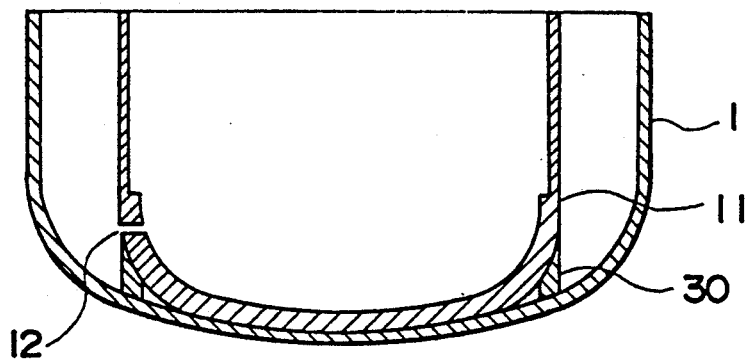
FIG. 8 is a longitudinal sectional view showing a partition member having upper and lower portions of different wall thickness and supported on a quartz cylindrical member.
Figure 9:
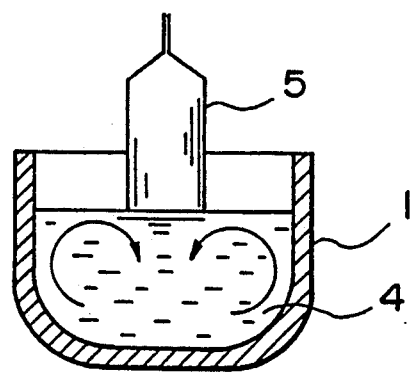
FIG. 9 is a diagram showing schematically the convection of the molten silicon within the single structure crucible.

FIG. 8 shows another embodiment of the present invention in which the partition member shown in FIG. 1 and having the upper and lower parts of different wall thicknesses is supported on the previously mentioned cylindrical quartz member 30. In accordance with the present embodiment, it is possible to pull a silicon single crystal more stably than in the case of the embodiment of FIG. 5.

In accordance with the silicon single crystal manufacturing crucible of the present invention by virtue of the fact that the partition member is of the crucible type, that the crucible bottom wall thickness is increased, that the portion of the partition member above the molten silicon surface is decreased in wall thickness and that the partition member is supported on the cylindrical quartz member, the heat environment of the molten silicon within the single crystal growing section is improved and any sinking deformation of the crucible-type partition member is prevented, thereby attaining the stable pulling of a silicon single crystal.

INDUSTRIAL APPLICABILITY

As a silicon single crystal manufacturing apparatus, the present invention is not only applicable to the manufacture of single crystals of silicon material but also applicable to the manufacture of single crystal os other materials than silicon.

We claim:

1. A silicon single crystal manufacturing apparatus including a crucible for containing molten silicon, an electric resistance heater for heating said glass crucible from the side thereof, a partition member arranged to divide said crucible into an inner single crystal growing section and an outer material melting section, said partition member having small holes for permitting said molten silicon to pass therethrough, and a feeder for continuously feeding silicon starting material to said material melting section, wherein:
   said partition member is crucible-shaped;
   a bottom outer surface of said partition member is closely fitted to said a bottom inner surface of said crucible; and
   wherein the average value of the wall thickness of said partition member above the surface of said molten silicon is 3 mm or greater and is 80% or less of the average value of the wall thickness of said partition member below said molten silicon surface.

2. A silicon single crystal manufacturing apparatus including a rotation-type crucible for containing molten silicon, an electric resistance heater for heating said glass crucible from the side thereof, a partition member for dividing said crucible into an inner single crystal growing section and an outer material melting section, said partition member having small holes for permitting said molten silicon to pass therethrough, and a feeder for continuously feeding silicon starting material to said material melting section, wherein:
   said partition member is crucible-shaped;
   a central portion of a bottom outer surface of said partition member is closely fitted to a bottom inner surface of said crucible; and
   said partition member is supported by a cylindrical member having an outer diameter greater than the inner diameter of said partition member and an inner diameter smaller than the outer diameter of said partition member.

3. A silicon single crystal manufacturing apparatus as set forth in claim 1, wherein said partition member is supported by a cylindrical member having an outer diameter greater than the inner diameter of said partition member and an inner diameter smaller than the outer diameter of said partition member.

4. A silicon single crystal manufacturing apparatus as set forth in claim 2, wherein said cylindrical member includes a plurality of holes for permitting said molten silicon to pass through from the outer diameter to the inner diameter of said cylindrical member.

5. A silicon single crystal manufacturing apparatus as set forth in claim 3, wherein said cylindrical member includes a plurality of holes for permitting said molten silicon to pass through from the outer diameter to the inner diameter of said cylindrical member.

* * * * *